United States Patent
Okamoto

(10) Patent No.: US 8,247,279 B2
(45) Date of Patent: Aug. 21, 2012

(54) METHOD OF FABRICATING SEMICONDUCTOR DEVICE USING EPITAXIAL GROWTH INHIBITING LAYERS

(75) Inventor: Shintaro Okamoto, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 135 days.

(21) Appl. No.: 12/559,436

(22) Filed: Sep. 14, 2009

(65) Prior Publication Data

US 2010/0078654 A1  Apr. 1, 2010

(30) Foreign Application Priority Data

Sep. 26, 2008 (JP) ................. 2008-247299

(51) Int. Cl.
*H01L 21/8238* (2006.01)

(52) U.S. Cl. ........ 438/199; 438/197; 438/218; 438/221; 438/222; 438/229; 438/230; 438/231; 438/232; 438/275; 438/294; 438/296; 438/299; 438/301; 438/303; 438/305; 438/306; 438/307

(58) Field of Classification Search .................. 438/197, 438/199, 218, 222, 229, 230, 275, 294, 299, 438/221, 231, 232, 296, 301, 303, 305, 306, 438/307

See application file for complete search history.

(56) References Cited

U.S. PATENT DOCUMENTS 7,825,003 B2 * 11/2010 Gauthier et al. ............. 438/423

7,935,593 B2 * 5/2011 Yang et al. ................... 438/231
2007/0122955 A1  5/2007 Luo et al.

FOREIGN PATENT DOCUMENTS

| JP | 2005-175082 | 6/2005 |
| JP | 2007-150319 | 6/2007 |
| JP | 2007-294780 | 11/2007 |

OTHER PUBLICATIONS

Background Art Information.

* cited by examiner

*Primary Examiner* — Jay C Kim
(74) *Attorney, Agent, or Firm* — Knobbe, Martens, Olson & Bear, LLP

(57) ABSTRACT

A semiconductor device according to one embodiment includes: a first transistor comprising a first gate electrode formed on a semiconductor substrate via a first gate insulating film, a first channel region formed in the substrate under the first film, and first epitaxial crystal layers formed on both sides of the first channel region in the substrate, the first layers comprising a first crystal; and a second transistor comprising a second gate electrode formed on the substrate via a second gate insulating film, a second channel region formed in the substrate under the second film, second epitaxial crystal layers formed on both sides of the second channel region in the substrate, and third epitaxial crystal layers formed on the second layers, the second layers comprising a second crystal, the third layers comprising the first crystal, the second transistor having a conductivity type different from that of the first transistor.

2 Claims, 7 Drawing Sheets

METHOD OF FABRICATING SEMICONDUCTOR DEVICE USING EPITAXIAL GROWTH INHIBITING LAYERS

CROSS-REFERENCE TO RELATED APPLICATIONS

This application is based upon and claims the benefit of priority from prior Japanese Patent Application No. 2008-247299, filed on Sep. 26, 2008, the entire contents of which are incorporated herein by reference.

BACKGROUND

As a fabrication technique of the semiconductor devices, a strained silicon technique, which strain is given a Si crystal in a channel region and operation speed of a transistor is improved, is known. This technique, for example, is disclosed in JP-A-2007-294780.

According to the technique disclosed in JP-A-2007-294780, etc., it is possible to generate a compressive strain in a channel region of a p-type transistor and then improve mobility of electric charges (positive holes) in the channel region by epitaxially growing a SiGe crystal, which has a lattice constant larger than that of a Si crystal, at a position that sandwiches the channel region of the p-type transistor.

In addition, it is possible to generate a tensile strain in the channel region of a n-type transistor and then improve mobility of electric charges (electrons) in the channel region by epitaxially growing a SiC crystal, which has a lattice constant smaller than that of a Si crystal, at a position that sandwiches the channel region of the n-type transistor.

However, according to a conventional method, when a semiconductor device mounting n-type MISFET and p-type MISFET together is fabricated, it is necessary to cover one transistor region with a cover film formed under a high temperature condition when a crystal is selectively epitaxially grown in the other transistor region.

Therefore, in the transistor region in which the crystal is grown first, a process to form the cover film on the epitaxial crystal is necessary, and thermal load on the epitaxial crystal increases at the time the cover film is formed.

As a result, a problem such as the deformation of the profile of the source/drain region by wide diffusion of conductivity type impurities in the epitaxial crystal may occur.

BRIEF SUMMARY

A semiconductor device according to one embodiment includes: a first transistor comprising a first gate electrode formed on a semiconductor substrate via a first gate insulating film, a first channel region formed in the semiconductor substrate under the first gate insulating film, and first epitaxial crystal layers formed on both sides of the first channel region in the semiconductor substrate, the first epitaxial crystal layers comprising a first crystal; and a second transistor comprising a second gate electrode formed on the semiconductor substrate via a second gate insulating film, a second channel region formed in the semiconductor substrate under the second gate insulating film, second epitaxial crystal layers formed on both sides of the second channel region in the semiconductor substrate, and third epitaxial crystal layers formed on the second epitaxial crystal layers, the second epitaxial crystal layers comprising a second crystal, the third epitaxial crystal layers comprising the first crystal, the second transistor having a conductivity type different from that of the first transistor.

A method of fabricating a semiconductor device according to another embodiment includes: forming first and second gate electrodes on first and second transistor regions in a semiconductor substrate via gate insulating films, respectively, the second transistor region having a conductivity type different from that of the first transistor region; forming first side walls and a cover film on side faces of the first gate electrode and on the second transistor region in the semiconductor substrate, respectively, the cover film comprising a material same as that of the first side walls; forming first trenches in the first transistor region by etching the semiconductor substrate using the cover film and the first side walls as masks; forming first epitaxial crystal layers by selectively epitaxially growing first Si system crystals in the first trenches; forming epitaxial growth inhibiting layers on the first epitaxial crystal layers; forming second trenches in the second transistor region by etching the semiconductor substrate using the first side walls, second side walls and the epitaxial growth inhibiting layers as masks after the cover film is shaped to the second side walls on side faces of the second gate electrode; and forming second epitaxial crystal layers by selectively epitaxially growing second Si system crystals in the second trenches.

A method of fabricating a semiconductor device according to another embodiment includes: forming first and second gate electrodes on first and second transistor regions in a semiconductor substrate via gate insulating films, respectively, the second transistor region having a conductivity type different from that of the first transistor region; forming first side walls and a cover film on side faces of the first gate electrode and on the second transistor region in the semiconductor substrate, respectively, the cover film comprising a material same as that of the first side walls; forming first trenches in the first transistor region by etching the semiconductor substrate using the cover film and the first side walls as masks; forming first epitaxial crystal layers by selectively epitaxially growing first Si system crystals in insides and upper regions of the first trenches; lowing a height of the upper surfaces of the first epitaxial crystal layers and forming second trenches in the second transistor region by etching the first epitaxial crystal layers the semiconductor substrate using the first side walls and second side walls as masks after the cover film is shaped to the second side walls on side faces of the second gate electrode; and forming second epitaxial crystal layers and third epitaxial crystal layers by selectively epitaxially growing second Si system crystals in the second trenches and on the first epitaxial crystal layers, respectively.

DETAILED DESCRIPTION

First Embodiment

Figure 1:
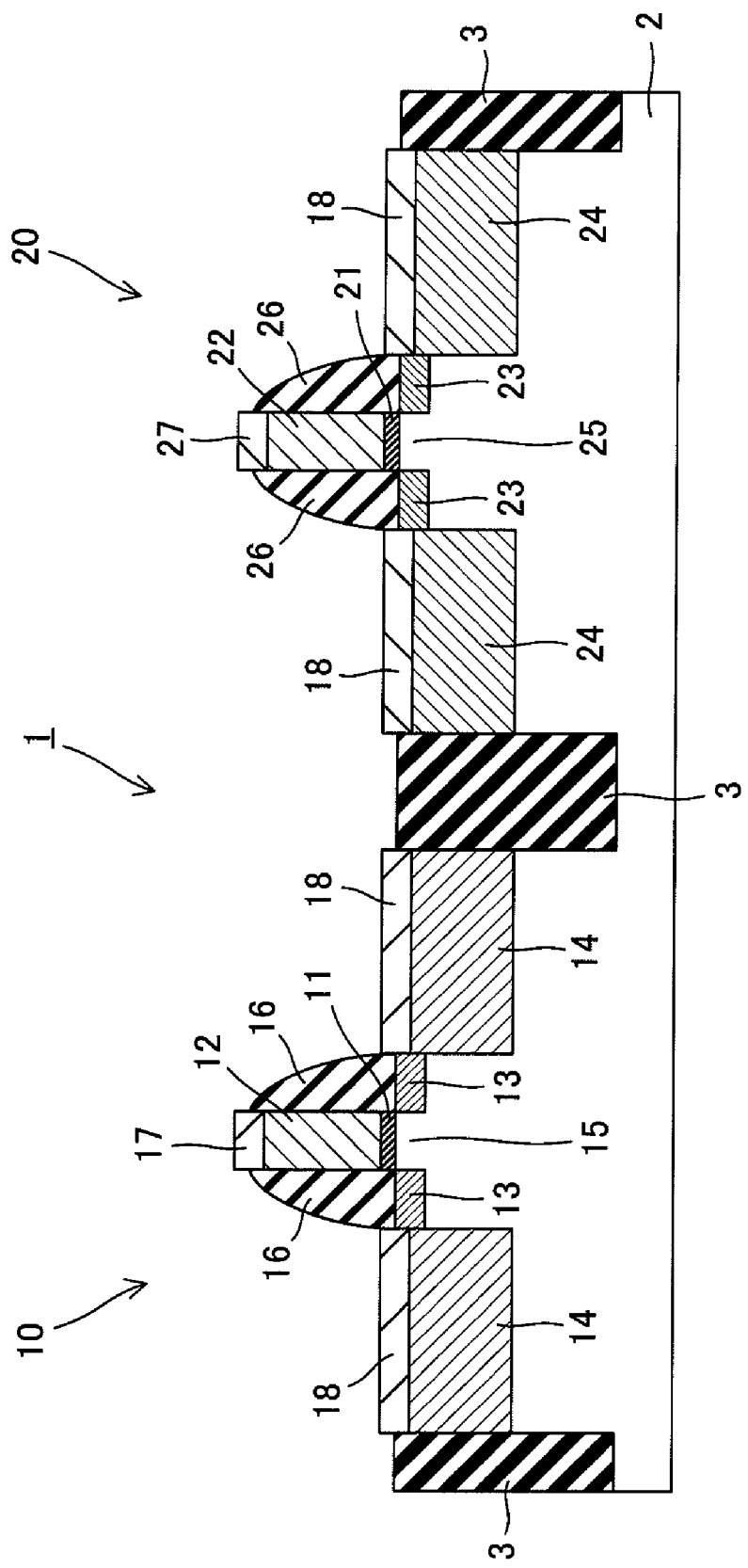
FIG. 1 is a cross sectional view showing a semiconductor device

FIG. 1 is a cross section showing a semiconductor device 1 according to the first embodiment. The semiconductor device 1 has a n-type transistor 10 and a p-type transistor 20 on a semiconductor substrate 2, and the n-type transistor 10 and the p-type transistor 20 are electrically isolated by element isolation region 3.

The semiconductor substrate 2 is made of a Si system crystal such as a Si crystal, etc.

The element isolation region 3 is made of an insulating material such as $SiO_2$, etc., and has a STI (Shallow Trench Isolation) structure.

The n-type transistor 10 includes a gate electrode 12 formed on the semiconductor substrate 2 via a gate insulating film 11, gate sidewalls 16 formed on side faces of the gate electrode 12, a silicide layer 17 formed on the gate electrode 12, a channel region 15 formed in a region in the semiconductor substrate 2 below the gate insulating film 11, extension regions 13 of source/drain regions formed on both sides of the channel region 15 in the semiconductor substrate 2, epitaxial crystal layers 14 formed on both sides of the extension regions 13, and silicide layers 18 formed on the epitaxial crystal layers 14. Note that, although it is not illustrated, a p-type well may be formed in a region in the semiconductor substrate 2 under the n-type transistor 10.

The p-type transistor 20 includes a gate electrode 22 formed on the semiconductor substrate 2 via a gate insulating film 21, gate sidewalls 26 formed on side faces of the gate electrode 22, a silicide layer 27 formed on the gate electrode 22, a channel region 25 formed in a region in the semiconductor substrate 2 below the gate insulating film 21, extension regions 23 of source/drain regions formed on both sides of the channel region 25 in the semiconductor substrate 2, epitaxial crystal layers 24 formed on both sides of the extension regions 23, and silicide layers 28 formed on the epitaxial crystal layers 24. Note that, although it is not illustrated, a n-type well may be formed in a region in the semiconductor substrate 2 under the p-type transistor 20.

The gate insulating films 11 and 21 are made of, e.g., an insulating material such as $SiO_2$, SiN or SiON, etc., or a high-k material such as an Hf-based compound (HfSiON, HfSiO or HfO, etc.), a Zr-based compound (ZrSiON, ZrSiO or ZrO, etc.) or a Y-based compound ($Y_2O_3$, etc.).

The gate electrodes 12 and 22 are made of, e.g., Si-based polycrystalline such as polycrystalline silicon, etc., containing conductivity type impurity. Here, an n-type impurity such as As, P is included in the gate electrode 12, and a P-type impurity such as B, BF2 is included in gate electrode 22. In addition, the gate electrodes 12 and 22 may be metal gate electrodes made of W, Ta, Ti, Hf, Zr, Ru, Pt, Ir, Mo or Al, etc., or a compound thereof, etc. Furthermore, the gate electrodes 12 and 22 may have a laminated structure in which Si-based polycrystalline gate electrode is formed on the metal gate electrode.

The silicide layers 17 and 27 are made of, for example, a compound of a metal such as Ni, Pt, Co, Er, Y, Yb, Ti, Pd, NiPt, or CoNi, etc., with Si. Note that, although the silicide layers 17 and 27 are formed by siliciding upper portions of the gate electrodes 12 and 22, fully silicided gate electrodes may be formed by siliciding the whole gate electrodes 12 and 22. In addition, the silicide layers 17 and 27 are not formed when the upper portions of the gate electrodes 12 and 22 are metal gate electrodes.

The gate sidewalls 16 and 26 may have a single layer structure comprising, e.g., SiN, or a structure of two layers comprising, e.g., SiN and $SiO_2$, furthermore, may have a structure of three or more layers.

The extension layers 13 are formed by implanting a n-type impurity such as As, P into a region of n-type transistor 10 in the semiconductor substrate 2. In addition, the extension layers 23 are formed by implanting a p-type impurity such as B, BF2 into a region of the p-type transistor 20 in the semiconductor substrate 2. Furthermore, silicide layers may be formed in upper portions of the extension layers 13, 23.

The epitaxial crystal layers 14 are made of a Si system crystal formed by epitaxial crystal growth technique. Specifically, the Si system crystal constituting the epitaxial crystal layers 14 is a crystal same as that constituting the semiconductor substrate 2, or a Si system crystal having a lattice constant smaller than that of the crystal constituting the semiconductor substrate 2. For example, in case that the semiconductor substrate 2 is made of a Si crystal, a Si crystal or a SiC crystal having a lattice constant smaller than that of a Si crystal may be used for the epitaxial crystal layers 14.

Here, in case that the epitaxial crystal layers 14 are made of a crystal has a lattice constant smaller than that of the crystal constituting the semiconductor substrate 2, it is possible that the epitaxial crystal layers 14 generate a tensile strain in the channel region 15, thereby improving mobility of electrons in the channel region 15.

Note that, when a SiC crystal is used for the epitaxial crystal layers 14, it is preferable that a C concentration in the SiC crystal is 1-3 At % (atomic percentage). When a C concentration in the SiC crystal is less than 1 At %, a strain generated in the channel region 15 is insufficient. In addition, when a C concentration in the SiC crystal is more than 3 At %, crystal defects may be generated in a substrate, etc., which may cause a leak current.

The epitaxial crystal layers 24 are made of a Si system crystal formed by epitaxial crystal growth technique. Specifically, the Si system crystal constituting the epitaxial crystal layers 24 is a crystal same as that constituting the semiconductor substrate 2, or a Si system crystal having a lattice constant larger than that of the crystal constituting the semiconductor substrate 2. For example, in case that the semiconductor substrate 2 is made of a Si crystal, a Si crystal or a SiGe crystal having a lattice constant larger than that of a Si crystal may be used for the epitaxial crystal layers 24.

Here, in case that the epitaxial crystal layers 24 are made of a crystal has a lattice constant larger than that of the crystal constituting the semiconductor substrate 2, it is possible that the epitaxial crystal layers 24 generate a compressive strain in the channel region 25, thereby improving mobility of positive holes in the channel region 25.

Note that, when a SiGe crystal is used for the epitaxial crystal layers 24, it is preferable that a Ge concentration in the SiGe crystal is 10-30 At %. When a Ge concentration in the SiGe crystal is less than 10 At %, a strain generated in the channel region 25 is insufficient. In addition, when that is more than 30 At %, crystal defects may be generated in a substrate, etc., which may cause a leak current.

The silicide layers 18 and 28 are made of, for example, a compound of a metal such as Ni, Pt, Co, Er, Y, Yb, Ti, Pd, NiPt, or CoNi, etc., with Si.

An example of a method of fabricating a semiconductor device 1 according to this embodiment will be described hereinafter.

FIGS. 2A to 2H are cross sectional views showing processes for fabricating the semiconductor device 1 according to the first embodiment.

Figure 2A:
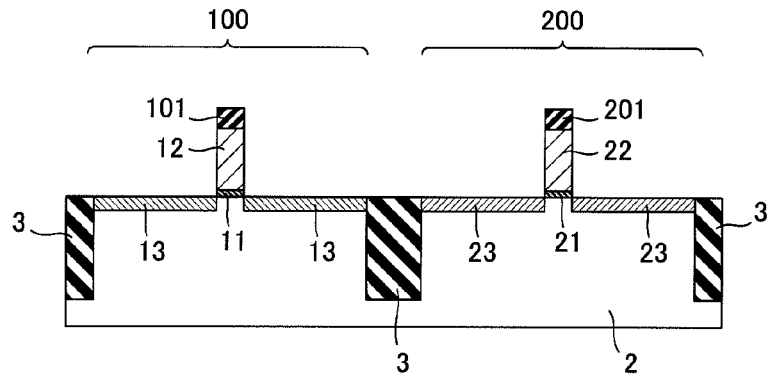
FIGS. 2A to 2K are cross sectional views showing processes for fabricating the semiconductor device according to the first embodiment.

Firstly, as shown in FIG. 2A, the gate insulating film 11, the gate electrode 12, a cap film 101 and the extension regions 13 are formed in a n-type transistor region 100, and the gate insulating film 21, the gate electrode 22, a cap film 201 and the extension regions 23 are formed in a p-type transistor region 200.

Here, the n-type transistor region 100 and the p-type transistor region 200 are a region in which the n-type transistor 10 is formed and a region in which the p-type transistor 20 is formed, respectively. In addition, the n-type transistor region 100 and the p-type transistor region 200 are isolated by element isolation region 3 each other.

The element isolation region 3 is formed by, e.g., following process. Firstly, a trench is formed in the semiconductor substrate 2 by photolithography method and RIE (Reactive Ion Etching) method. Next, a $SiO_2$ film is deposited in the trench by CVD (Chemical Vapor Deposition) method, and is substantially planarized by CMP (Chemical Mechanical Polishing) method, thereby processing into the element isolation region 3.

The gate insulating films 11 and 21, the gate electrodes 12 and 22, and the cap films 101 and 201 are formed by, e.g., following process. Firstly, an oxide film is formed by oxidizing a surface of the semiconductor substrate 2. Next, by CVD method, etc., a Si polycrystal film and a SiN film are laminated on the oxide film. Next, by photolithography method and RIE method, the SiN film, the Si polycrystal film and the oxide film are patterned and shaped into the cap films 101 and 201, the gate electrodes 12 and 22, and gate insulating films 11 and 21, respectively.

Note that, though the cap films 101 and 201 have a function to prevent crystals from growing up on upper surfaces of the gate electrodes 12 and 22 in a posterior process, the cap films 101 and 201 may not be formed. In addition, the cap films 101 and 201 are not formed when the gate electrodes 12 and 22 are metal gate electrodes.

The extension layers 13 are formed by implanting an n-type impurity into the n-type transistor region 100 in the semiconductor substrate 2 using the cap film 101 and the gate electrode 12 as a mask, by an ion implantation procedure, etc. In addition, the extension layers 23 are formed by implanting a p-type impurity into the p-type transistor region 200 in the semiconductor substrate 2 using the cap films 201 and the gate electrode 22 as masks, by ion implantation procedure, etc.

Figure 2B:
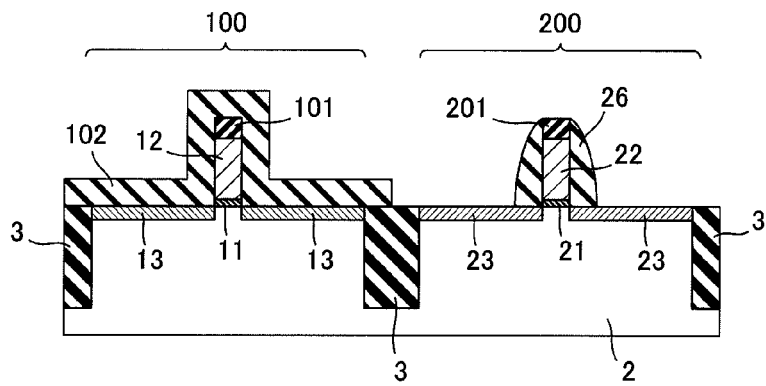

Next, as shown in FIG. 2B, a cover film 102 is formed in the n-type transistor region 100, and the gate sidewalls 26 are formed on side faces of the cap film 201 and the gate electrode 22 in the p-type transistor region 200.

The cover film 102 and the gate sidewalls 26 are formed by, e.g., following process. Firstly, by CVD method, a SiN film which is material film of the cover film 102 and the gate sidewall 26 is formed on the n-type transistor region 100 and the p-type transistor region 200 in the semiconductor substrate 2 under a temperature condition of 700° C. Next, The SiN film is removed so as to leave portions thereof located on side faces of the cap film 201 and the gate electrode 22 by selectively applying anisotropic etching such as RIE to the SiN film on the n-type transistor region 100, thereby forming the gate sidewalls 26. The portions, which is left in p-type transistor region 200 without being etched, of the SiN film become the cover film 102.

Figure 2C:
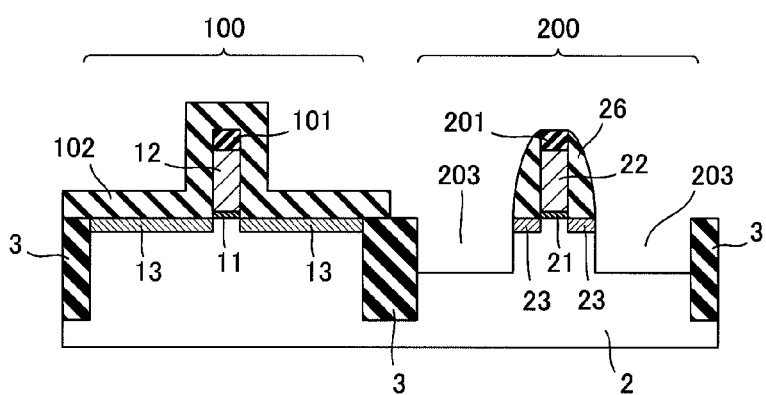

Next, as shown in FIG. 2C, the semiconductor substrate 2 is etched using the cover film 102 and the gate sidewalls 26 as masks, thereby forming trenches 203 in the p-type transistor region 200.

The trenches 203 are formed using RIE method or wet etching method, etc. The etching does not reach the n-type transistor region 100 in the semiconductor substrate 2 since that is covered by the cover film 102.

Figure 2D:
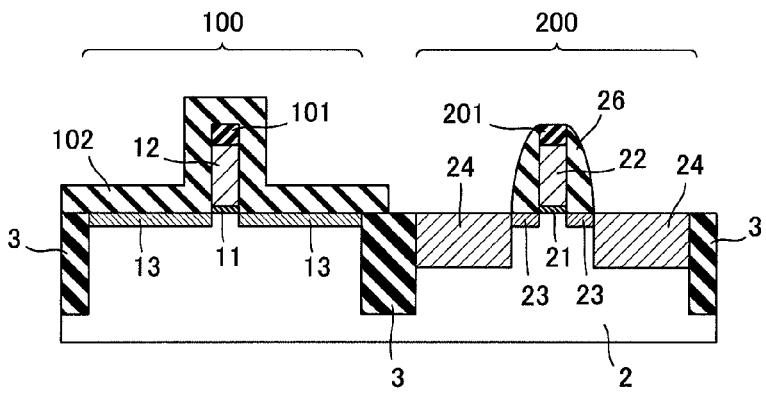

Next, as shown in FIG. 2D, the epitaxial crystal layers 24 are formed in the trenches 203 by epitaxially growing Si system crystals such as SiGe crystals, etc., using a surface of the semiconductor substrate 2 in the p-type transistor region 200, i.e., inner surfaces of the trenches 203 as a base.

Here, it is preferable to implant p-type impurities into the Si system crystals at the same time the Si system crystals are grown (which is referred to as in-situ doping). In case that the in-situ doping method is used for implantation of p-type impurities, unlike in case that ion implantation procedure is used, thermal load on the epitaxial crystal layers 24 can be reduced since it is not necessary to activate the P-type impurities which is implanted by high temperature heat treatment such as spikes RTA (Rapid Thermal Annealing), etc.

In case that a SiGe crystal is used for the epitaxial crystal layers 24, the SiGe crystal is epitaxially grown by, for example, SEG (Selective Epitaxial Growth) process under a temperature condition of 700-900° C. Here, the SEG process is a process in which a gas, which is for nonselectively growing a crystal on a Si crystal layer or an insulation film, and an etching gas, which is for removing the crystal on the insulation film having low-growth rate, are used at the same time. HCl gas, etc., is used as the etching gas.

In the SEG process, on a surface of the semiconductor substrate 2, quantity that the crystals are grown is larger than quantity that the crystals are removed by the etching since growth rate of crystals is high. As a result, the crystals are grown on the surface of the semiconductor substrate 2 with time. On the other hand, on surfaces of the cover film 102, the element isolation region 3, the gate sidewalls 26 and the cap film 201, quantity that the crystals are grown is small since only crystalline nucleus are dispersively grown. Therefore, quantity that the crystals are grown is smaller than quantity that the crystals are removed by the etching. As a result, no crystal is grown on these portions. For this reason, it is possible to selectively form the epitaxial crystal layers 24 in the trenches 203.

Figure 2E:
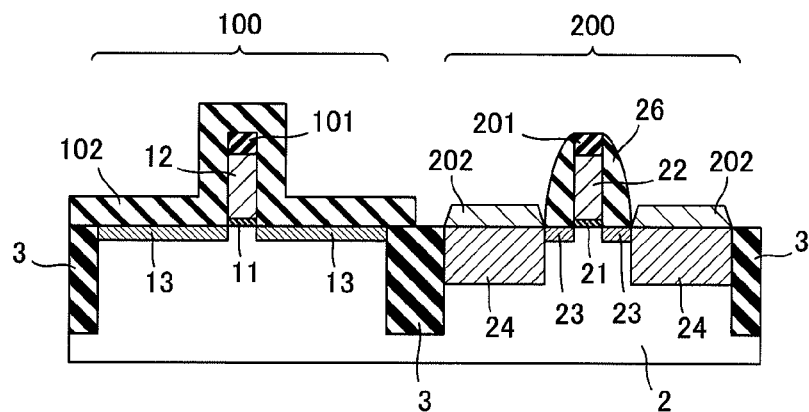

Next, as shown in FIG. 2E, epitaxial growth inhibiting layers 202 are formed on the epitaxial crystal layers 24.

Here, the epitaxial growth inhibiting layers 202 are made of a Si system crystal including crystal defects or a Si system amorphous material. Crystals are hardly epitaxially grown on the epitaxial growth inhibiting layers 202.

By increasing concentration of Ge or the conductivity type impurity such as B, crystal defects are generated in the Si system crystal or the Si system crystal is transformed into amorphous material. In other words, as the process shown in FIG. 2D, the epitaxial crystal 24 is formed by growing the Si system crystals in a state in which density of Ge or the conductivity type impurity is kept normal until the trenches 203 are filled by the Si system crystals. After that, the Si system crystals are continuously grown in a state in which the density of Ge or the conductivity type impurity is increased, thereby forming the epitaxial growth inhibiting layers 202.

Furthermore, by implanting relatively heavy elements such as Ge into the Si system crystals using ion implantation procedure, crystal defects are generated in the Si system crystal or the Si system crystal is transformed into amorphous material. Therefore, the epitaxial growth restraint layers 202 may be formed using the following method. Firstly, as the process shown in FIG. 2D, the epitaxial crystal 24 is formed by growing the Si system crystals until the trenches 203 are filled by the Si system crystals. Next, the Si system crystals are continuously grown to upper regions of the trenches 203 without changing a growth condition. After that, the epitaxial growth inhibiting layers 202 is formed by implanting element such as Ge into portions of the Si system crystals in upper regions of the trenches 203 (in other words, the portions are upper portions on lower portions which become the epitaxial crystal 24 of the Si system crystals).

Figure 2F:
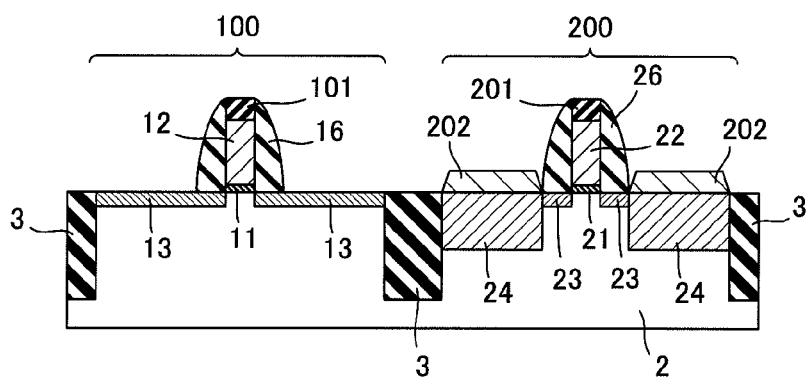

Next, as shown in FIG. 2F, the cover film 102 in the n-type transistor region 100 is shaped to the gate sidewalls 16.

The cover film 102 in the n-type transistor region 100 is removed so as to leave portions thereof located on side faces of the cap film 201 and the gate electrode 22 by selectively applying anisotropic etching such as RIE to the cover film 102, thereby forming the gate sidewalls 16.

Figure 2G:
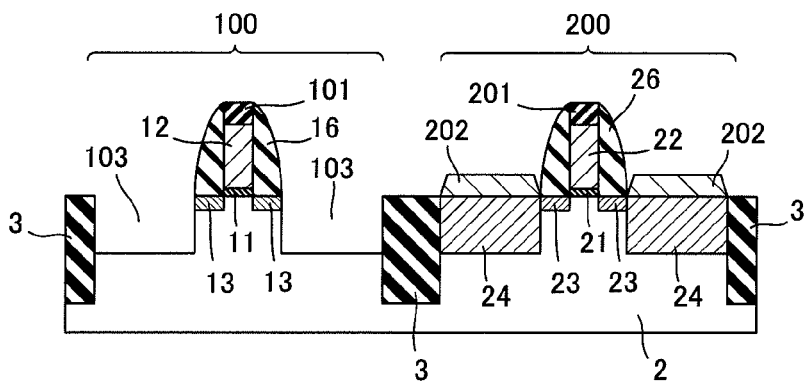

Next, as shown in FIG. 2G, the semiconductor substrate 2 is etched using the gate sidewalls 16 and the epitaxial growth inhibiting layers 202 as masks, thereby forming trenches 103 in the n-type transistor region 100.

The trenches 103 are formed using RIE method or wet etching method, etc. The etching does not reach the epitaxial crystal layers 24 since that is covered by the epitaxial growth inhibiting layers 202.

Figure 2H:
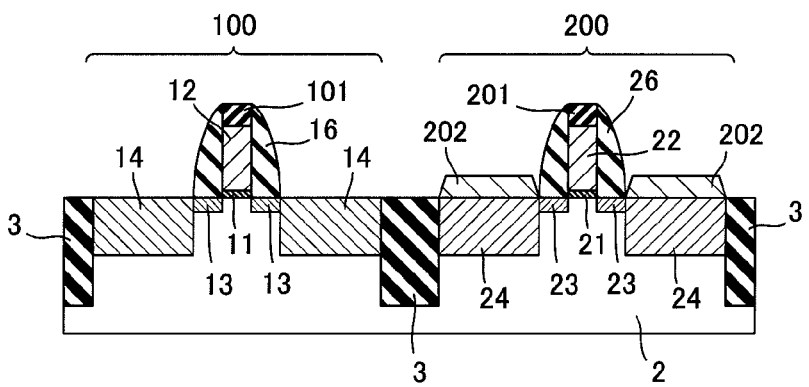

Next, as shown in FIG. 2H, the epitaxial crystal layers 14 are formed in the trenches 103 by epitaxially growing Si system crystals such as SiC crystals, etc., using a surface of the semiconductor substrate 2 in the n-type transistor region 100, i.e., inner surfaces of the trenches 103 as a base.

Here, it is preferable to implant n-type impurities into the Si system crystals at the same time the Si system crystals are grown (which is referred to as in-situ doping). In case that the in-situ doping method is used for implantation of n-type impurities, unlike in case that ion implantation procedure is used, thermal load on the epitaxial crystal layers 14 can be reduced since it is not necessary to activate then-type impurities which is implanted by high temperature heat treatment such as spikes RTA (Rapid Thermal Annealing), etc.

In case that a SiC crystal is used for the epitaxial crystal layers 14, the SiC crystal is epitaxially grown by, for example, SEG process under a temperature condition of about 500° C. Here, on surfaces of the epitaxial growth inhibiting layers 202, the element isolation region 3, the gate sidewalls 16 and 26, and the cap film 101 and 201, quantity that the crystals are grown is small. Therefore, quantity that the crystals are grown is smaller than quantity that the crystals are removed by the etching. As a result, no crystal is grown on these portions. For this reason, it is possible to selectively form the epitaxial crystal layers 14 in the trenches 103.

Figure 2I:
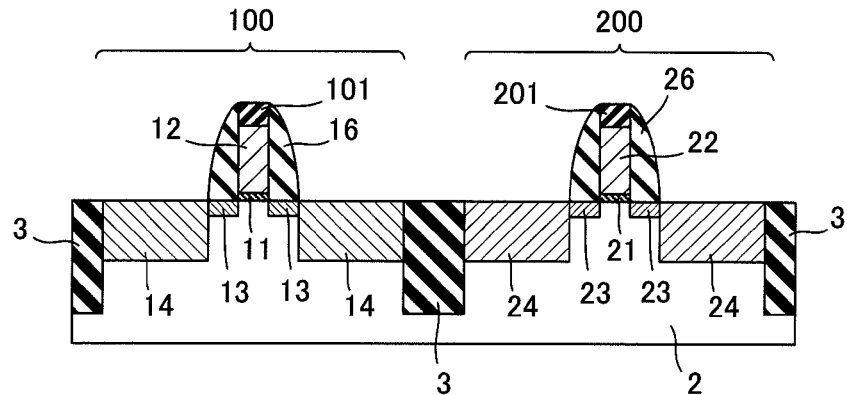

Next, as shown in FIG. 2I, the epitaxial growth inhibiting layers 202 are removed by, for example, wet etching method using HF/ozone water, etc., as an etchant.

Figure 2J:
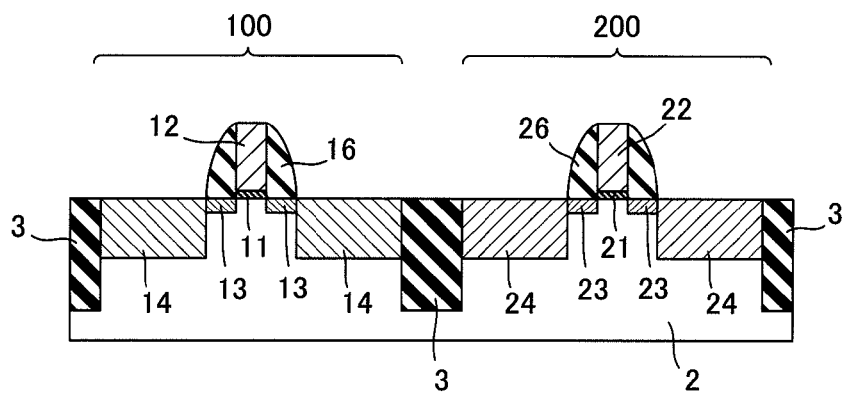

Next, as shown in FIG. 2J, the cap films 101 and 201 are removed by RIE method, etc.

Figure 2K:
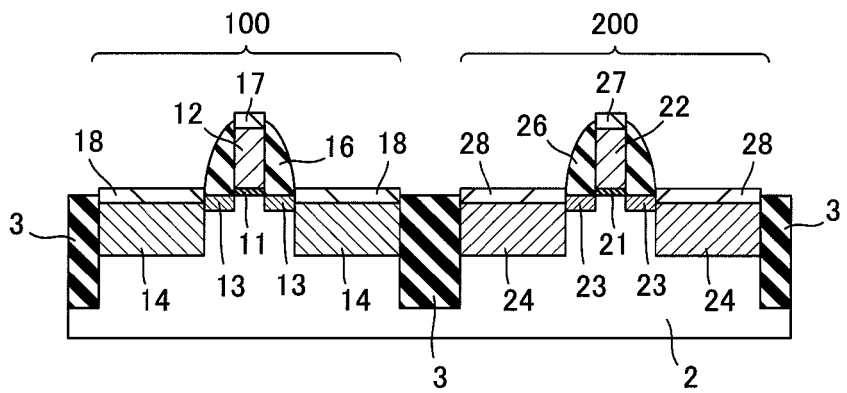

Next, as shown in FIG. 2K, the silicide layers 17 and 27 are formed on the gate electrodes 12 and 22, and the silicide layers 18 and 28 are formed on the epitaxial crystal layers 14 and 24.

The silicide layers 17, 27, 18 and 28 are formed by, e.g., following process. Firstly, a metal film such as a Ni film is formed on the n-type transistor region 100 and the p-type transistor region 200 in the semiconductor substrate 2 by PVD method, etc. Next, the silicide layers 17, 27, 18 and 28 are formed by a silicidation reaction between upper surfaces of the gate electrodes 12 and 22 and the metal film and a silicidation reaction between upper surfaces of the epitaxial crystal layers 14 and 24 and the metal film generated by heat treatment. Note that, the unreacted metal film is removed by wet etching method, etc.

Effect of the First Embodiment

According to the first embodiment, the thermal load on the epitaxial crystal layers 14 and 24 can be reduced since a process in which a cover film formed under a high temperature condition is formed on the epitaxial crystal layers 14 and 24 is not included. Therefore, it is possible to avoid a problem such as the deformation of the profile of the source/drain region by wide diffusion of conductivity type impurities in the epitaxial crystal layers 14 and 24.

Specifically, a process in which a cover film formed on the p-type transistor region 200 in the semiconductor substrate 2 can be omitted by using the epitaxial growth inhibiting layers 202 as etching masks when the trenches 103 are formed. As a result, the thermal load on the epitaxial crystal layers 24 can be reduced. In addition, the thermal load on the epitaxial crystal layers 14 also can be reduced since that is formed after the process in which the cover film 102 is formed.

Second Embodiment

The second embodiment is different from the first embodiment in that the epitaxial crystal layers 24 are formed higher and used as masks when the trenches 103 are formed, instead of forming the epitaxial growth inhibiting layers 202. Note that, the explanation will be omitted or simplified for the same points as the first embodiment.

Figure 3:
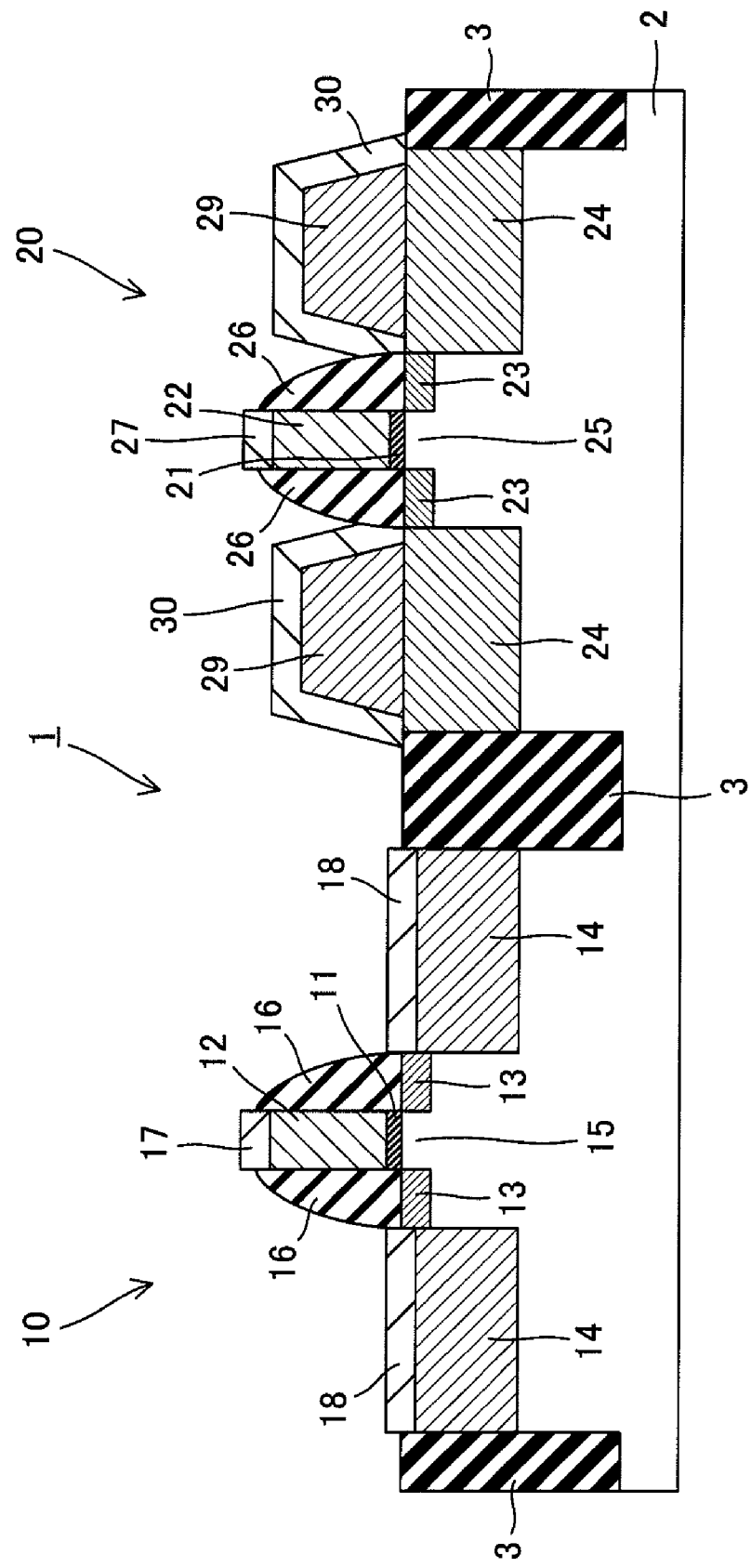
FIG. 3 is a cross sectional view showing a semiconductor device according to a second embodiment.

FIG. 3 is a cross section showing a semiconductor device 1 according to the second embodiment. The semiconductor device 1 has a n-type transistor 10 and a p-type transistor 20 on a semiconductor substrate 2, and the n-type transistor 10 and the p-type transistor 20 are electrically isolated by element isolation region 3.

The n-type transistor 10 includes a gate electrode 12 formed on the semiconductor substrate 2 via a gate insulating film 11, gate sidewalls 16 formed on side faces of the gate electrode 12, a silicide layer 17 formed on the gate electrode 12, a channel region 15 formed in a region in the semiconductor substrate 2 below the gate insulating film 11, extension regions 13 of source/drain regions formed on both sides of the channel region 15 in the semiconductor substrate 2, epitaxial crystal layers 14 formed on both sides of the extension regions 13, and silicide layers 18 formed on the epitaxial crystal layers 14. Note that, although it is not illustrated, a p-type well may be formed in a region in the semiconductor substrate 2 under the n-type transistor 10.

The p-type transistor 20 includes a gate electrode 22 formed on the semiconductor substrate 2 via a gate insulating film 21, gate sidewalls 26 formed on side faces of the gate electrode 22, a silicide layer 27 formed on the gate electrode 22, a channel region 25 formed in a region in the semiconductor substrate 2 below the gate insulating film 21, extension regions 23 of source/drain regions formed on both sides of the channel region 25 in the semiconductor substrate 2, epitaxial crystal layers 24 formed on both sides of the extension regions 23, epitaxial crystal layers 29 formed on the epitaxial crystal layers 24, and silicide layers 30 formed on the epitaxial crystal layers 29. Note that, although it is not illustrated, a n-type well may be formed in a region in the semiconductor substrate 2 under the p-type transistor 20.

The epitaxial crystal layers 29 are made of a Si system crystal, which is same as that constituting the epitaxial crystal layers 14, formed by epitaxial crystal growth technique. Specifically, the Si system crystal constituting the epitaxial crystal layers 14 and 29 is a crystal same as that constituting the semiconductor substrate 2, or a Si system crystal having a lattice constant smaller than that of the crystal constituting the semiconductor substrate 2. For example, in case that the semiconductor substrate 2 is made of a Si crystal, a Si crystal or a SiC crystal having a lattice constant smaller than that of a Si crystal may be used for the epitaxial crystal layers 14 and 29.

Note that, most of strain in the channel region 25 is generated by the epitaxial crystal layers 24 because of positional relationship between them. Therefore, the strain in the channel region 25 is little influenced by the epitaxial crystal layers 29.

The silicide layers 18 and 30 are made of, for example, a compound of a metal such as Ni, Pt, Co, Er, Y, Yb, Ti, Pd, NiPt, or CoNi, etc., with Si.

An example of a method of fabricating a semiconductor device 1 according to this embodiment will be described hereinafter.

FIGS. 4A to 4F are cross sectional views showing processes for fabricating the semiconductor device 1 according to the second embodiment.

Firstly, the processes until the process, shown in FIG. 2C, for forming the trenches 203 in the p-type transistor region 200 are carried out in the same way as the first embodiment.

Figure 4A:
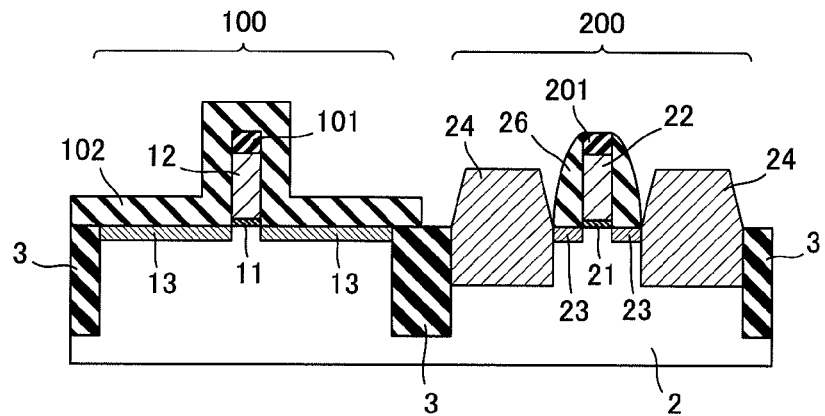
FIGS. 4A to 4F are cross sectional views showing processes for fabricating the semiconductor device according to the second embodiment.

Next, as shown in FIG. 4A, the epitaxial crystal layers 24 are formed in the insides and upper regions of the trenches 203 by epitaxially growing Si system crystals such as SiGe crystals, etc., using a surface of the semiconductor substrate 2 in the p-type transistor region 200 (i.e., inner surfaces of the trenches 203) as a base.

Although a formation method of the epitaxial crystal layers 24 is same as that in the first embodiment, the epitaxial crystal layers 24 is formed so that a height thereof is higher than that in the first embodiment.

Figure 4B:
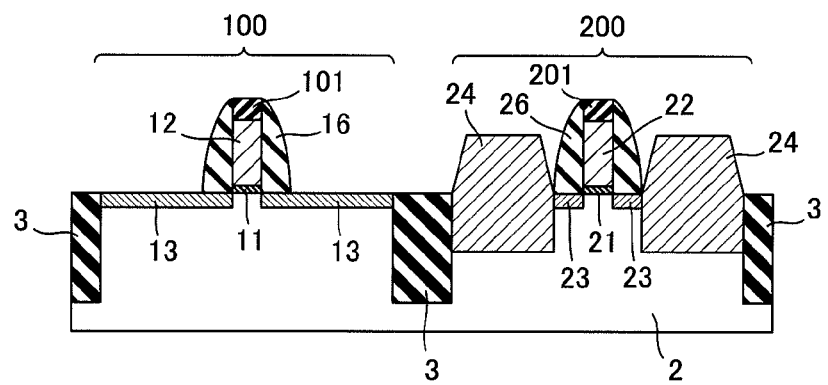

Next, as shown in FIG. 4B, the cover film 102 in the n-type transistor region 100 is shaped to the gate sidewalls 16.

Figure 4C:
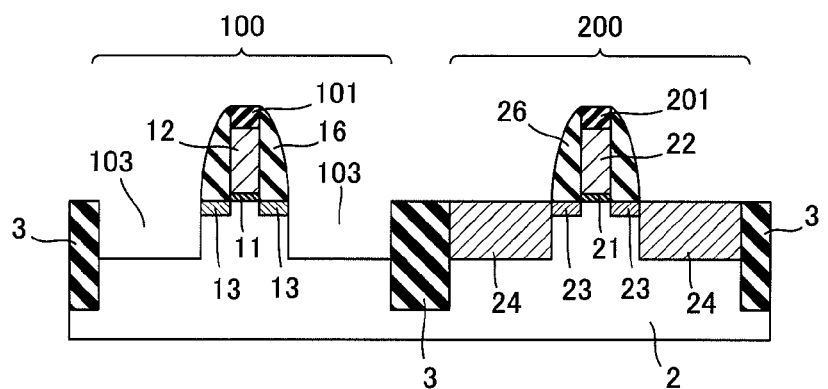

Next, as shown in FIG. 4C, the semiconductor substrate 2 is etched using the gate sidewalls 16 and portions of the epitaxial crystal layers 24 which are mainly formed in the upper region of the trenches 203 as masks, thereby forming trenches 103 in the n-type transistor region 100.

In this process, a surface of the semiconductor substrate 2 in the n-type transistor region 100 and the epitaxial crystal layers 24 are etched. Therefore, the height of the upper surfaces of the epitaxial crystal layers 24 is lowered, and the epitaxial crystal layers 24 reach size fitting into the insides of the trenches 203.

Figure 4D:
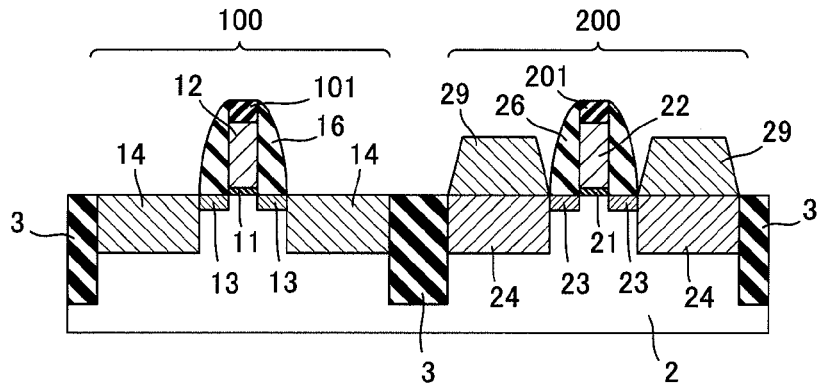

Next, as shown in FIG. 4D, by the SEG process, etc., the epitaxial crystal layers 14 and 29 are formed in the trenches 103 and on the epitaxial crystal layers 24 by epitaxially growing Si system crystals such as SiC crystals, etc., using the surface of the semiconductor substrate 2 in the n-type transistor region 100 (i.e., inner surfaces of the trenches 103) and upper surfaces of the epitaxial crystal layers 24 as a base.

Here, if an n-type impurity is implanted into a Si system crystal by in-situ doping method, performance of the p-type transistor 20 is decreased since the n-type impurity is also implanted into the epitaxial crystal layers 29. Therefore, it is preferable to selectively implant the n-type impurity into the n-type transistor region 100 for implanting the n-type impurity into the epitaxial crystal layers 14.

Figure 4E:
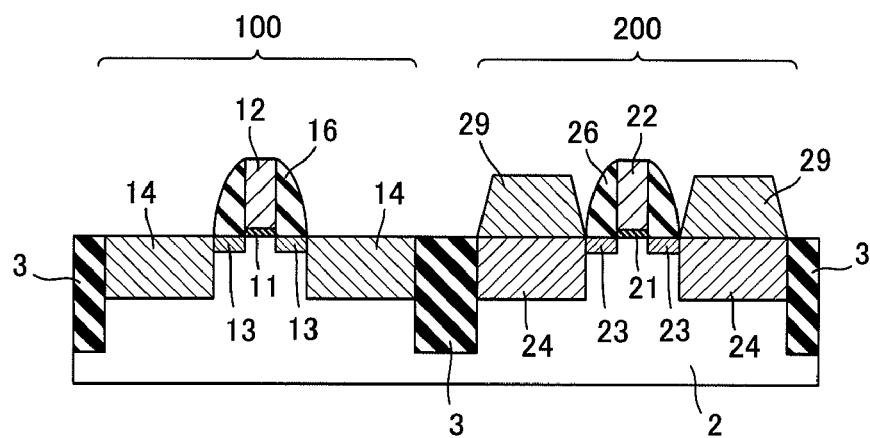

Next, as shown in FIG. 4E, the cap films 101 and 201 are removed by RIE method, etc.

Figure 4F:
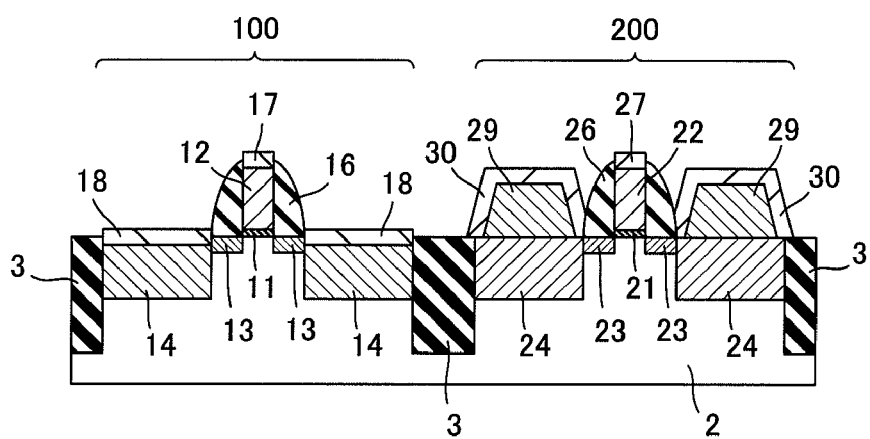

Next, as shown in FIG. 4F, the silicide layers 17 and 27 are formed on the gate electrodes 12 and 22, and the silicide layers 18 and 30 are formed on the epitaxial crystal layers 14 and 29.

The silicide layers 17, 27, 18 and 30 are formed by, e.g., following process. Firstly, a metal film such as a Ni film is formed on the n-type transistor region 100 and the p-type transistor region 200 in the semiconductor substrate 2 by PVD method, etc. Next, the silicide layers 17, 27, 18 and 30 are formed by a silicidation reaction between upper surfaces of the gate electrodes 12 and 22 and the metal film and a silicidation reaction between upper surfaces of the epitaxial crystal layers 14 and 29 and the metal film generated by heat treatment. Note that, the unreacted metal film is removed by wet etching method, etc.

Note that, a silicide of a metal such as Ni with SiGe is thermodynamically unstable. Therefore, when a SiGe crystal is used for the epitaxial crystal layers 24, generation of a leak current caused by abnormal growth of a silicide, etc., can be suppressed in case that the silicide is formed on the epitaxial crystal layers 29 as compared with in case that the silicide is formed on the epitaxial crystal layers 24 similarly to the first embodiment.

Effect of the Second Embodiment

According to the second embodiment, the thermal load on the epitaxial crystal layers 14, 24 and 29 can be reduced since a process in which a cover film formed under a high temperature condition is formed on the epitaxial crystal layers 14, 24 and 29 is not included, similarly to the first embodiment. Therefore, it is possible to avoid a problem such as the deformation of the profile of the source/drain region by wide diffusion of conductivity type impurities in the epitaxial crystal layers 14, 24 and 29.

Specifically, a process in which a cover film formed on the p-type transistor region 200 in the semiconductor substrate 2 can be omitted by using the portions of the epitaxial crystal layers 24 which are mainly formed in the upper region of the trenches 203 as etching masks when the trenches 103 are formed. As a result, the thermal load on the epitaxial crystal layers 24 can be reduced.

Other Embodiments

It should be noted that embodiments are not intended to be limited to the above-mentioned first to third embodiments, and the various kinds of changes thereof can be implemented by those skilled in the art without departing from the gist of the invention.

In addition, the constituent elements of the above-mentioned embodiments can be arbitrarily combined with each other without departing from the gist of the invention.

What is claimed is:

1. A method of fabricating semiconductor device, comprising:

forming first and second gate electrodes on first and second transistor regions in a semiconductor substrate via gate insulating films, respectively, wherein the second transistor region has a conductivity type different from a conductivity type of the first transistor region;

forming first side walls on side faces of the first gate electrode and forming a cover film on the second transistor region, the cover film comprising a material same as a material of the first side walls;

forming first trenches in the first transistor region by etching the semiconductor substrate using the cover film and the first side walls as masks;

forming first epitaxial crystal layers by selectively epitaxially growing first Si system crystals in the first trenches;

forming selectively epitaxial growth inhibiting layers only on the first epitaxial crystal layers;

forming second trenches in the second transistor region by etching the semiconductor substrate using the first side walls, second side walls and the epitaxial growth inhibiting layers as masks after the cover film is shaped to form the second side walls on side faces of the second gate electrode; and forming second epitaxial crystal layers by selectively epitaxially growing second Si system crystals in the second trenches, wherein the epitaxial growth inhibiting layers comprise a Si system crystal including crystal defects or a Si system amorphous material, the first epitaxial crystal layers are formed by epitaxially growing the first Si system crystals while implanting conductivity type impurity having a predetermined concentration into the first Si system crystals, and the epitaxial growth inhibiting layers are formed by epitaxially growing the first Si system crystals while implanting the conductivity type impurity at a concentration higher than the predetermined concentration into the first Si system crystals.

2. The method of claim 1, wherein the first Si system crystals are SiGe crystals; and the second Si system crystals are SiC crystals.

* * * * *